(12) United States Patent
Young et al.

(10) Patent No.: US 7,771,623 B2
(45) Date of Patent: Aug. 10, 2010

(54) ALUMINUM THICK FILM COMPOSITION(S), ELECTRODE(S), SEMICONDUCTOR DEVICE(S) AND METHODS OF MAKING THEREOF

(75) Inventors: Richard John Sheffield Young, Somerset (GB); Michael Rose, South Gloucestershire (GB); Julie Ann Raby, Bristol (GB); Kenneth Warren Hang, Hillsborough, NC (US)

(73) Assignee: E.I. du Pont de Nemours and Company Dupont (UK) Limited, Wilmington, DE (US)

( * ) Notice: Subject to any disclaimer, the term of this patent is extended or adjusted under 35 U.S.C. 154(b) by 0 days.

(21) Appl. No.: 11/443,780

(22) Filed: May 31, 2006

(65) Prior Publication Data
US 2006/0272700 A1    Dec. 7, 2006

Related U.S. Application Data

(60) Provisional application No. 60/688,097, filed on Jun. 7, 2005.

(51) Int. Cl.
*H01B 1/22*    (2006.01)
*B05D 5/12*    (2006.01)

(52) U.S. Cl. .................. 252/512; 252/514; 427/96.1
(58) Field of Classification Search ............. 252/512, 252/514; 427/96.1
See application file for complete search history.

(56) References Cited

U.S. PATENT DOCUMENTS

| | | | |
|---|---|---|---|
| 3,972,720 A * | 8/1976 | Hammel et al. .............. 501/66 |
| 4,256,513 A | 3/1981 | Yoshida et al. | |
| 5,178,685 A | 1/1993 | Borenstein et al. | |
| 5,380,372 A | 1/1995 | Campe et al. | |
| 5,627,081 A | 5/1997 | Tsuo et al. | |
| 5,645,765 A | 7/1997 | Asada et al. | |
| 5,899,704 A | 5/1999 | Schlosser et al. | |
| 6,096,968 A | 8/2000 | Schlosser et al. | |
| 6,117,367 A | 9/2000 | Bezama et al. | |
| 6,294,726 B1 | 9/2001 | Hassler et al. | |
| 6,448,105 B1 | 9/2002 | Sterk | |
| 6,541,695 B1 | 4/2003 | Mowles | |
| 6,703,295 B2 | 3/2004 | Meier et al. | |
| 7,138,347 B2 * | 11/2006 | Konno ........................ 501/19 |
| 2002/0062858 A1 | 5/2002 | Mowles | |

(Continued)

FOREIGN PATENT DOCUMENTS

EP    1713094 A2    10/2006

(Continued)

OTHER PUBLICATIONS

Richard J.S. Young and Alan F. Carroll, Advances in Front-Side Thick Film Metallisations for Silicon Solar Cells, 16th PVSEC Glasgow.

(Continued)

*Primary Examiner*—Mark Kopec

(57) ABSTRACT

The present invention is directed to a thick film conductor composition comprised of (a) aluminum-containing powder; (b) at least one glass frit composition; dispersed in (c) organic medium wherein said glass frit composition upon firing undergoes a recrystallization process and liberates both a glass and a crystalline phase and wherein said glass phase of said recrystallization process comprises a glass that has a lower softening point than the original softening point of said glass frit composition.

13 Claims, 5 Drawing Sheets

U.S. PATENT DOCUMENTS

2006/0231803 A1* 10/2006 Wang et al. .................. 252/500

FOREIGN PATENT DOCUMENTS

WO      WO 94/07268      3/1994
WO      WO 02/082472      * 10/2002

OTHER PUBLICATIONS

Alan F. Carroll, Christian Frederic, Richard J. S. Young, Improved Frontside Silver Paste for CZ SI Cells, 17th European Photovoltaic Solar Energy Conf. (17th PVSEC), Munich, Germany, Oct. 2001.

Julie A. Raby, Richard J.S. Young, Michael Rose, Alan F. Carroll, Investigation into the Factors that Influence the Quality of Soldered Ribbon Attachment on Silicon Solar Cells.

A. Schneider, C. Gerhards, F. Huster, W. Neu, M. Spiegel, P. Fath, E. Bucher, R.J.S. Young, A.G. Prince, J.A. Raby, A.F. Carroll, AL BSF for Thin Screenprinted Multicrystalline SI Solar Cells.

A. Schneider, C. Gerhards, P. Fath, E. Bucher, R.J.S. Young, J.A. Raby, A.F. Carroll, Bow Reducing Factors for Thin Screenprinted MC-SI Solar Cells with AL BSF.

Mario Bahr, Stefan Dauwe, Alexander Lawerenz and Lutz Mittelstadt, Comparison of Bow-Avoiding Al-Pastes for Thin, Large-Area Crystalline Silicon Solar Cells.

* cited by examiner

US 7,771,623 B2

ALUMINUM THICK FILM COMPOSITION(S), ELECTRODE(S), SEMICONDUCTOR DEVICE(S) AND METHODS OF MAKING THEREOF

FIELD OF THE INVENTION

The present invention is directed primarily to thick film compositions, electrodes, and semiconductor devices. It is further directed to a silicon semiconductor device. In particular, it pertains to an electroconductive composition used in the formation of a thick film electrode of a solar cell.

BACKGROUND OF THE INVENTION

The present invention can be applied to a broad range of semiconductor devices, although it is especially effective in light-receiving elements such as photodiodes and solar cells. The background of the invention is described below with reference to solar cells, as a specific example of the prior art.

A conventional solar cell structure with a p-type base has a negative electrode that is typically on the front-side or sun side of the cell and a positive electrode on the back-side. It is well known that radiation of an appropriate wavelength falling on a p-n junction of a semiconductor body serves as a source of external energy to generate hole-electron pairs in that body. The potential difference that exists at a p-n junction causes holes and electrons to move across the junction in opposite directions and thereby give rise to flow of an electric current that is capable of delivering power to an external circuit. Most solar cells are in the form of a silicon wafer that has been metallized, i.e., provided with metal contacts which are electrically conductive.

During the formation of the solar cell, an Al paste is generally screen printed and dried on the back-side of the silicon wafer. The wafer is then fired at a temperature above the melting point of Al to form a Al—Si melt, subsequently, during the cooling phase, a epitaxially grown layer of silicon is formed that is doped with Al. This layer is generally called the back surface field (BSF) layer, and helps to improve the energy conversion efficiency of the solar cell.

Most electric power-generating solar cells currently used are silicon solar cells. Process flow in mass production is generally aimed at achieving maximum simplification and minimizing manufacturing costs. Electrodes in particular are made by using a method such as screen printing from a metal paste.

An example of this method of production is described below in conjunction with FIG. 1. FIG. 1 shows a p-type silicon substrate, 10.

In FIG. 1(b), an n-type diffusion layer, 20 of the reverse conductivity type is formed by the thermal diffusion of phosphorus (P) or the like. Phosphorus oxychloride ($POCl_3$) is commonly used as the gaseous phosphorus diffusion source; other liquid sources are phosphoric acid and the like. In the absence of any particular modification, the diffusion layer, 20 is formed over the entire surface of the silicon substrate, 10. This diffusion layer has a sheet resistivity on the order of several tens of ohms per square ($\Omega/\square$), and a thickness of about 0.3 to 0.5 µm. The p-n junction is formed where the concentration of the p-type dopant equals the concentration of the n-type dopant, conventional cells that have the p-n junction close to the sun side, have a junction depth between 0.05 and 0.5 um.

After formation of this diffusion layer, excess surface glass is removed from the rest of the surfaces by etching by an acid such as hydrofluoric acid. Next, a silicon nitride film, 30, is formed as an anti-reflection coating on the n-type diffusion layer, 20, to a thickness of between 0.05 and 0.1 um in the manner shown in FIG. 1(d) by a process, such as plasma chemical vapor deposition (CVD).

As shown in FIG. 1(e), a silver paste, 500, for the front electrode is screen printed then dried over the silicon nitride film, 30. In addition, a back-side silver or silver/aluminum paste, 70, and an aluminum paste, 60, are then screen printed (or some other application method) and successively dried on the back-side of the substrate. Normally, the back side silver or silver/aluminum is screen printed onto the silicon first as two parallel strips or as rectangles ready for soldering interconnection strings (presoldered copper ribbons), the aluminum is then printed in the bare areas with a slight overlap over the silver or silver/aluminum. In some cases, the silver or silver/aluminum is printed after the aluminum has been printed. Firing is then typically carried out in an infrared furnace at a temperature range of approximately 700 to 950° C. for a period of from several seconds to several tens of minutes. The front and back electrodes can be fired sequentially or co-fired.

Consequently, as shown in FIG. 1(f), molten aluminum from the paste dissolves the silicon during the firing process and then on cooling dopes the silicon that epitaxially grows from the silicon base, 10, forming a p+ layer, 40, containing a high concentration of aluminum dopant. This layer is generally called the back surface field (BSF) layer, and helps to improve the energy conversion efficiency of the solar cell.

The aluminum paste is transformed by firing from a dried state, 60, to an aluminum back electrode, 61. Prior art back-side aluminum pastes typically utilize aluminum particles of predominantly spherical shape derived from the atomization process where the particles are formed and wherein the particle sizes and shapes are not discriminated. The back-side silver or silver/aluminum paste, 70, is fired at the same time, becoming a silver or silver/aluminum back electrode, 71. During firing, the boundary between the back side aluminum and the back side silver or silver/aluminum assumes an alloy state, and is connected electrically as well. The aluminum electrode accounts for most areas of the back electrode, owing in part to the need to form a p+ layer, 40. Because soldering to an aluminum electrode is impossible, a silver or silver/aluminum back electrode is formed over portions of the back side (often as 2-6 mm wide busbars) as an electrode for interconnecting solar cells by means of pre-soldered copper ribbon or the like. In addition, the front electrode-forming silver paste, 500, sinters and penetrates through the silicon nitride film, 30, during firing, and is thereby able to electrically contact the n-type layer, 20. This type of process is generally called "firing through." This fired through state is apparent in layer 501 of FIG. 1(f).

Additionally, while conventional solar cells provide a working design, there is still a need to provide higher efficiency devices. There is also a need to provide a method of forming such a device at lower temperatures than the prior art. Such a method would allow for co-firing over a wider range of temperatures so as to provide manufacturers with increased flexibility and would enable compensation of thermal work for thicker and thinner wafer sources. The present invention provides such a device and method for its formation.

Furthermore, there is an on-going effort to provide compositions which are Pb-free while at the same time maintaining electrical performance and other relevant properties of the device. The present inventors create novel aluminum comprising composition(s) and semiconductor devices that simultaneously provide such a Pb-free system while still maintaining electrical performance and novel compositions that provide superior electrical performance. Furthermore, the composition(s) of the present invention lead to reduced bowing in some embodiments of the invention.

SUMMARY OF THE INVENTION

The present invention relates to a thick film conductor composition for use in forming a p-type electrode. It further relates to the process of forming such compositions and use of the composition in semiconductor devices and the semiconductor device itself.

The present invention is directed to a thick film conductor composition comprised of (a) aluminum-containing powder; (b) at least one glass frit composition; dispersed in (c) organic medium wherein said glass frit composition upon firing undergoes a recrystallization process and liberates both a glass and a crystalline phase and wherein said glass phase of said recrystallization process comprises a glass that has a lower softening point than the original softening point of said glass frit composition.

The present invention is further directed to a process of forming a solar cell utilizing a silicon substrate having a p-type and an n-type region, and a p-n junction, which comprises screen-printing the back-side of said substrate, screen printing the composition detailed above, and firing the printed surface at a temperature of 500-990 degrees C.

Figure 1A:
FIG. 1 is a process flow diagram illustrating the fabrication of a semiconductor device.
Figure 1B:
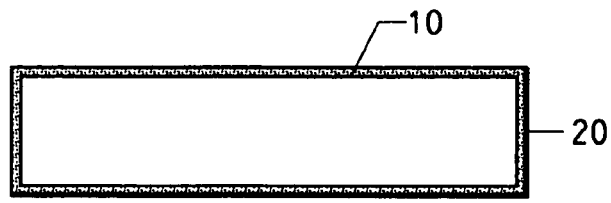
Figure 1C:
Figure 1D:
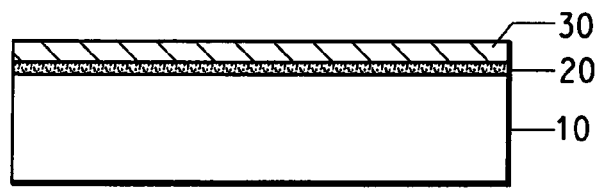
Figure 1E:
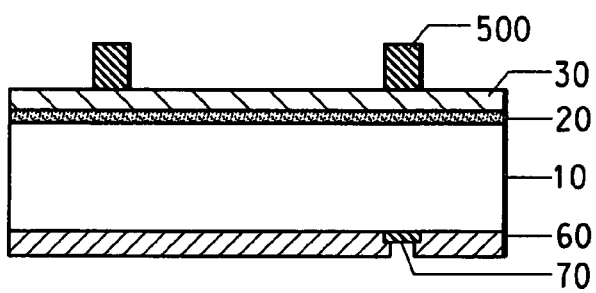
Figure 1F:
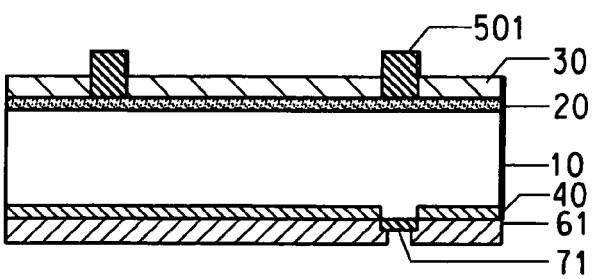
Figure 2A:
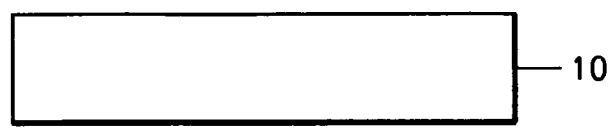
Figure 2B:
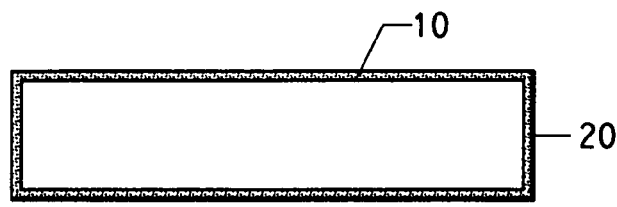
Figure 2C:
Figure 2D:
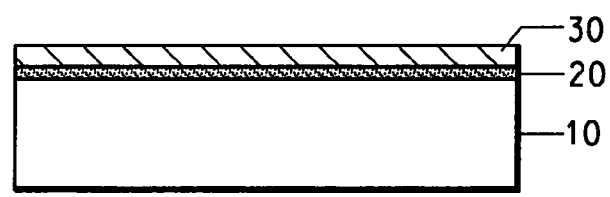
Figure 2E:
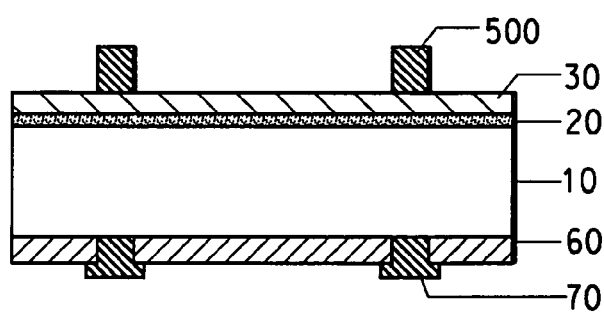
Figure 2F:
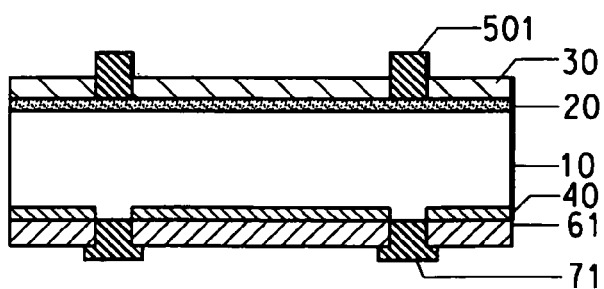

Reference numerals shown in FIG. 1 are explained below.
10: p-type silicon substrate
20: n-type diffusion layer
30: silicon nitride film, titanium oxide film, or silicon oxide film
40: p+ layer (back surface field, BSF)
60: aluminum paste formed on back-side
61: aluminum back electrode (obtained by firing back-side aluminum paste)
70: silver/aluminum paste formed on back-side
71: silver/aluminum back electrode (obtained by firing back-side silver/aluminum paste)
500: silver paste formed on front side
501: silver front electrode (formed by firing front side silver paste)

Figure 3:
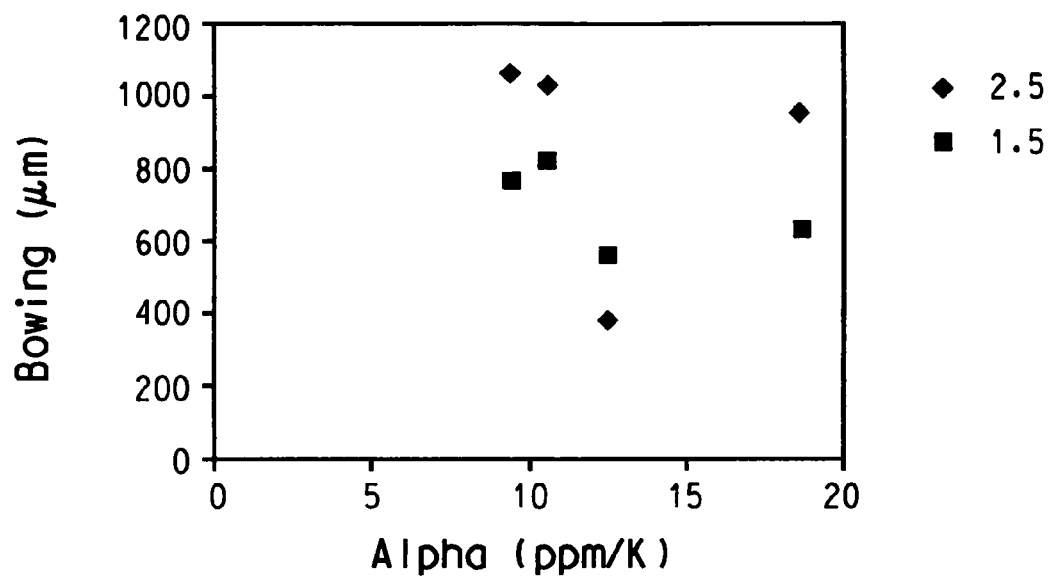
Figure 4:
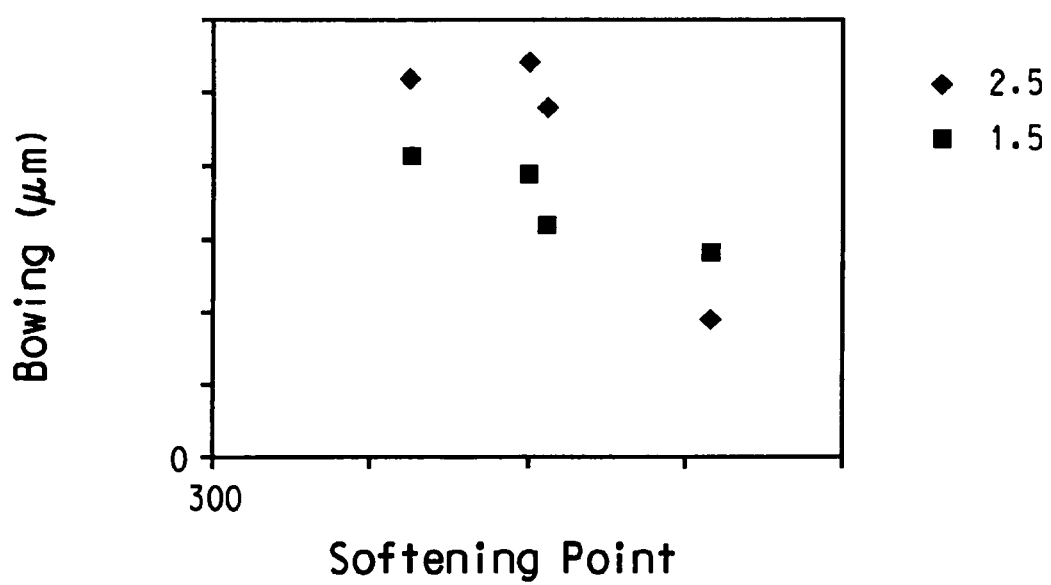
Figure 5:
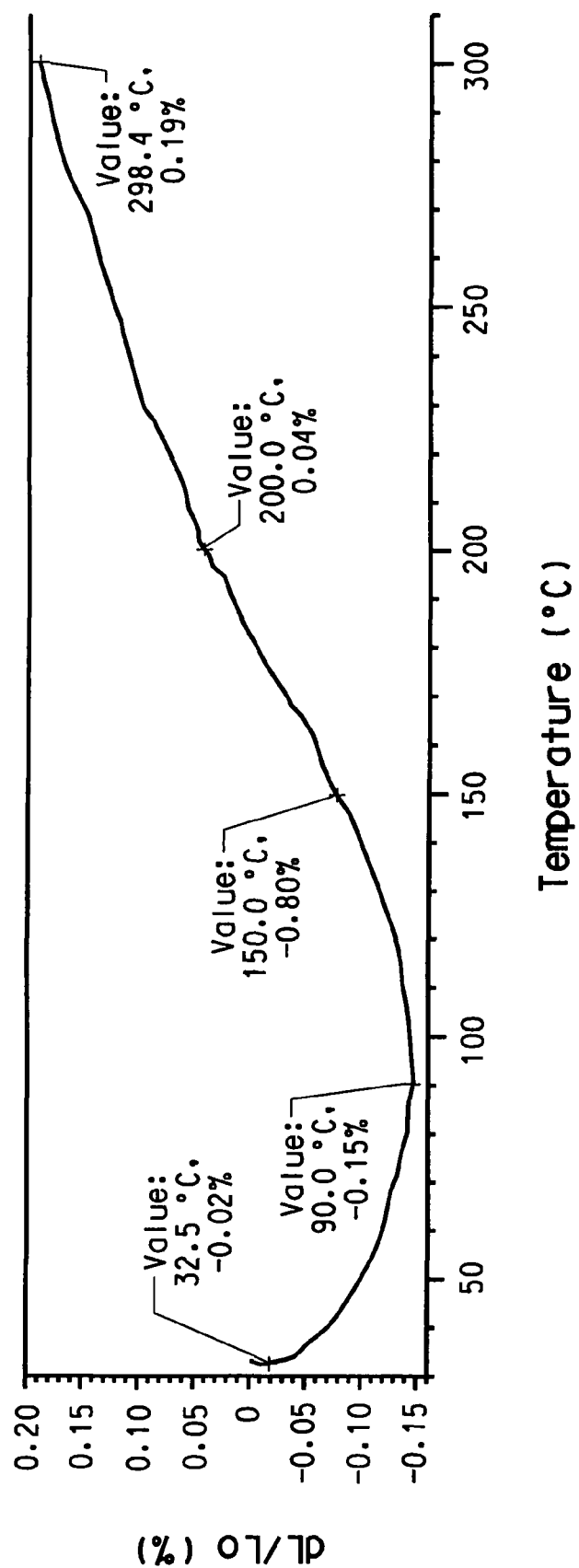
Figure 6:
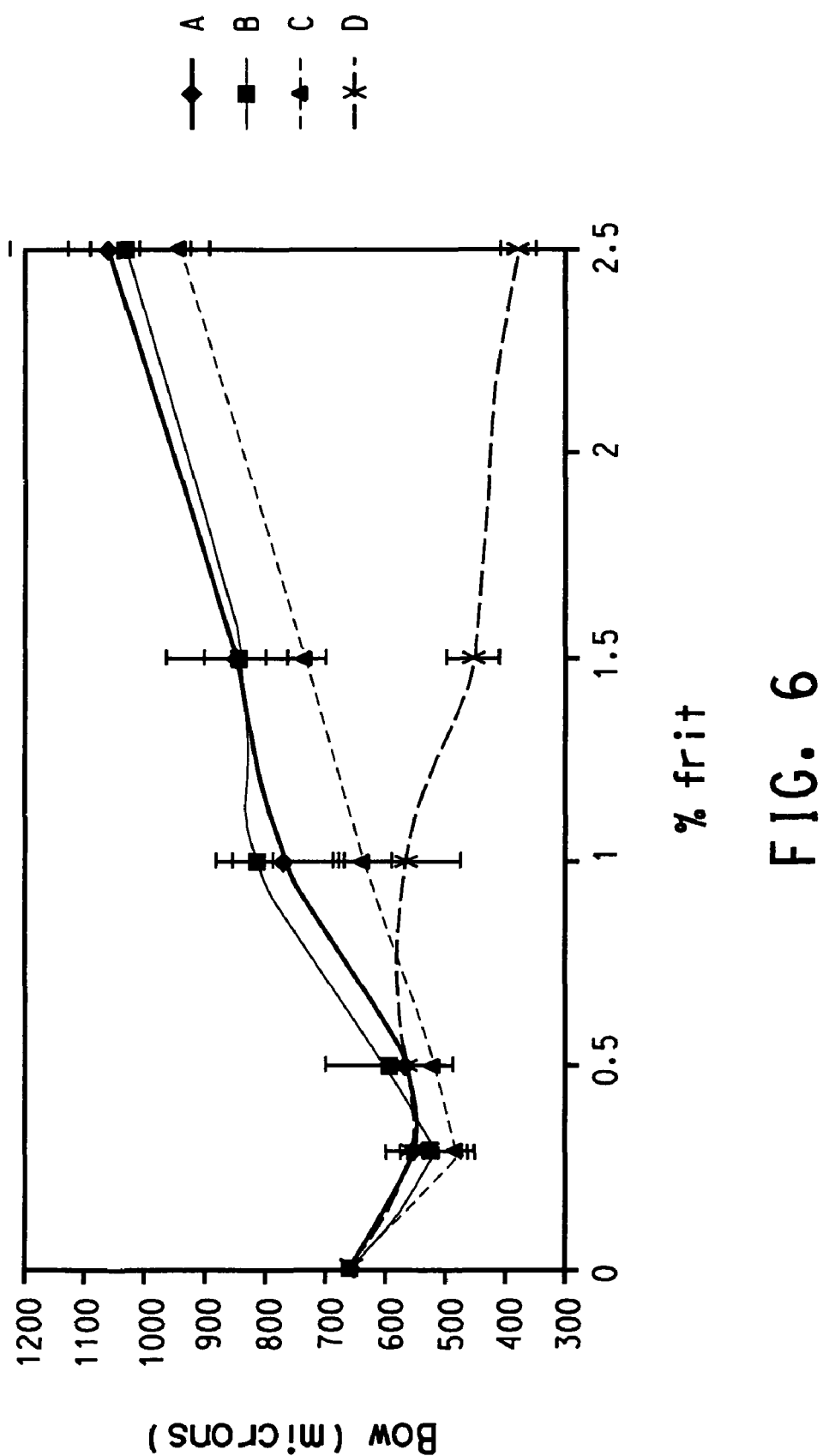

FIGS. 2(a)-(f) explain the manufacturing processes for manufacturing a solar cell using the electroconductive paste of the present invention. Reference numerals shown in FIG. 2 are explained below.
102 Silicon substrate
104 Light-receiving surface side electrode
106 Paste composition for a first electrode
108 Electroconductive paste for a second electrode
110 First electrode
112 Second electrode FIG. 3 details bowing as a function of alpha (ppm/K).
FIG. 4 details bowing as a function of softening point.
FIG. 5 presents a dilatometric evaluation of the expansion characteristics of Glass D.
FIG. 6 details bowing as a function of the percent of glass frit in a 270 micron wafers.

DETAILED DESCRIPTION OF THE INVENTION

The main components of the thick film composition(s) of the present invention are an aluminum-containing powder, glass frit, and organic medium. In one embodiment, the glass frit in the composition is a Pb-free glass composition. The composition(s) of the present invention allow for superior electrical performance as compared to the prior art. The compositions also provide lower bowing than prior art systems.

Aluminum-Containing Powder

The metallic powder of the present invention is an aluminum-containing powder. In one embodiment, the aluminum-containing powder comprises atomized aluminum. The atomized aluminum may be atomized in either air or inert atmosphere. The average particle size distribution of the atomized aluminum powder is in the range of 3 to 50 microns. The average particle size distribution of the aluminum-containing powder is in the range of 3 to 20 microns.

The aluminum-containing powder of the present invention may be further accompanied by other metallic powders such as silver-containing powders.

Inorganic Binder(s)-Glass Frit(s)

The aluminum-containing powders described herein above are finely dispersed in an organic medium and are additionally accompanied by one or more inorganic binders. Specifically, the inorganic binder(s) useful in the present invention are glass frit(s). The present invention must comprise at least one glass frit composition wherein upon firing said glass frit composition undergoes recrystallization or phase separation and liberates a frit with a separated phase that has a lower softening point than the original softening point. Thus, the thick film composition comprising such a glass frit upon processing gives lower bowing properties. Typically, the original softening point of the glass frit composition is in the range of 325° C. to 600° C.

In one embodiment the thick film conductor composition is comprised of aluminum-containing powder, at least one glass frit composition, dispersed in organic medium, wherein the glass frit composition, upon firing, undergoes a recrystallization process and liberates both a glass and a crystalline phase and wherein said glass phase of said recrystallization process comprises a glass that has a lower softening point than the original softening point of said glass frit composition.

In another embodiment the thick film conductor composition is comprised of aluminum-containing powder, at least one glass frit composition, and is dispersed in organic medium wherein the glass frit composition upon firing undergoes a recrystallization process and liberates both a glass and a crystalline phase, wherein said glass phase of said recrystallization process comprises a glass that has a lower softening point than the original softening point of said glass frit composition and further comprising a glass frit composition that exhibits negative temperature coefficient of expansion in the temperature range of 20° C. to 200° C.

In one embodiment, the glass frit of the present invention is a Pb-free glass frit which, upon firing, undergoes recrystallization or phase separation and liberates a frit with a separated phase that has a lower softening point than the original softening point. Mixtures one or more frits are possible.

The function of an inorganic binder in an aluminum composition is primarily to provide a means to increase the efficiency by which the silicon is accessed by the molten aluminum during the firing process. In addition to this function, the binder provides some additional cohesion and adhesion properties to the substrate. The need for the inorganic binder in this instance is most important for silicon substrates that have layers of silica or siliceous glasses as remnants from wafer processing. The inorganic binder affects the bowing of the aluminum layer in the finished cell. The binder can also increase the alloying depth of the aluminum into the silicon, therefore enhancing or increasing the aluminum dopant concentration in the eutectically grown silicon layer.

The chemistry of the glass frit(s) of the present invention are important. The glass frit(s) are chosen based on the effectiveness that it they have on improving the electrical performance of the aluminum thick film paste without compromising other considerations such as environmental legislation or public desire to exclude heavy metals of potential environmental concern.

The content of the glass frit as an inorganic binder is important in that it affects the electrical performance of the resultant cell. The content is determined by the glass or inorganic content and is between 0.01 weight percent and 5 weight percent based on the total thick film composition, with a preferred level for electrical performance and bowing in the range 0.01 weight percent and 2 weight percent, dependent on the chemistry of the glass frit.

Glass binders useful in the composition are known in the art. Some examples include borosilicate and aluminosilicate glasses. Examples further include combinations of oxides, such as: $B_2O_3$, $SiO_2$, $Al_2O_3$, CdO, CaO, BaO, ZnO, $SiO_2$, $Na_2O$, $Li_2O$, PbO, and ZrO which may be used independently or in combination to form glass binders. Typical metal oxides useful in thick film compositions are known and can be, for example, ZnO, MgO, CoO, NiO, FeO, MnO and mixtures thereof. Glass binders that influence the bowing properties are specific in composition.

The conventional glass frits preferably used are the borosilicate frits, such as lead borosilicate frit, bismuth, cadmium, barium, calcium, or other alkaline earth borosilicate frits. The preparation of such glass frits is well known and consists, for example, in melting together the constituents of the glass in the form of the oxides of the constituents and pouring such molten composition into water to form the frit. The batch ingredients may, of course, be any compounds that will yield the desired oxides under the usual conditions of frit production. For example, boric oxide will be obtained from boric acid, silicon dioxide will be produced from flint, barium oxide will be produced from barium carbonate, etc.

The glass is preferably milled in a ball mill with water or inert low viscosity, low boiling point organic liquid to reduce the particle size of the frit and to obtain a frit of substantially uniform size. It is then settled in water or said organic liquid to separate fines and the supernatant fluid containing the fines is removed. Other methods of classification may be used as well.

The glasses are prepared by conventional glassmaking techniques, by mixing the desired components in the desired proportions and heating the mixture to form a melt. As is well known in the art, heating is conducted to a peak temperature and for a time such that the melt becomes entirely liquid and homogeneous. The desired glass transition temperature is in the range of 325° C. to 600° C.

It is preferred that at least 85% the inorganic binder particles be 0.1-10 μm. The reason for this is that smaller particles having a high surface area tend to adsorb the organic materials and thus impede clean decomposition. On the other hand, larger size particles tend to have poorer sintering characteristics. It is preferred that the weight ratio of inorganic binder to total paste contents be in the range 0.1 to-2.0 and more preferably in the range 0.2 to 1.25.

Organic Medium

The inorganic components are typically mixed with an organic medium by mechanical mixing to form viscous compositions called "pastes", having suitable consistency and rheology for printing. A wide variety of inert viscous materials can be used as organic medium. The organic medium must be one in which the inorganic components are dispersible with an adequate degree of stability. The rheological properties of the medium must be such that they lend good application properties to the composition, including: stable dispersion of solids, appropriate viscosity and thixotropy for screen printing, appropriate wettability of the substrate and the paste solids, a good drying rate, and good firing properties. The organic vehicle used in the thick film composition of the present invention is preferably a nonaqueous inert liquid. Use can be made of any of various organic vehicles, which may or may not contain thickeners, stabilizers and/or other common additives. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The polymer present in the organic medium is in the range of 0 weight percent to 11 weight percent of the total composition. The thick film composition of the present invention may be adjusted to a predetermined, screen-printable viscosity with the organic polymer containing medium.

The ratio of organic medium in the thick film composition to the inorganic components in the dispersion is dependent on the method of applying the paste and the kind of organic medium used, and it can vary. Usually, the dispersion will contain 40-95 wt % of inorganic components and 5-60 wt % of organic medium (vehicle) in order to obtain good wetting.

Within the claims, the addition of polymers or organic species or inorganic species that provide exothermic chemical reactions between 280° C. and 900° C. are found to be beneficial to the overall performance of the system where these species are not regarded as a poison towards the semiconductor properties of the doped silicon system.

The electroconductive paste of the present invention is typically conveniently manufactured by power mixing, a dispersion technique that is equivalent to the traditional roll milling, roll milling or other mixing technique can also be used. The electroconductive paste of the present invention is preferably spread on the desired part of the back face of a solar cell by screen printing; in spreading by such a method, it is preferable to have a viscosity in a prescribed range. Other application methods can be used such as silicone pad printing. The viscosity of the electroconductive paste of the present invention is preferably 20-200 PaS when it is measured at a spindle speed of 10 rpm and 25° C. by a utility cup using a Brookfield HBT viscometer and #14 spindle.

The silver/aluminum or silver film can be cofired with the aluminum paste of the present invention at the same time in a process called cofiring. Next, an example in which a solar cell is prepared using the electroconductive paste (aluminum electroconductive paste) of the present invention is explained, referring to the Figure (FIG. 2).

First, a Si substrate 102 is prepared. On the light-receiving side face (surface) of the Si substrate, normally with the p-n junction close to the surface, electrodes (for example, electrodes mainly composed of Ag) 104 are installed (FIG. 2(*a*)). On the back face of the substrate, a Ag or Ag/Al electroconductive paste (although it is not particularly limited as long as it is used for a solar cell, for example, PV202 or PV502 or PV583 or PV581 (commercially available from E. I. du Pont de Nemours and Company)) is spread to form either bus bars or tabs to enable interconnection with other cells set in parallel electrical configuration. On the back face of the substrate, the novel aluminum pastes of the present invention used as a back face (or p-type contact) electrode for a solar cell, 106 are spread by screen printing using the pattern that enable slight overlap with the conductive Ag or Ag/Al paste referred to above, etc, then dried (FIG. 2(*b*)). The drying temperature of each paste is preferably 150° C. or lower in a static drier for 20 minutes or 7 minutes in a belt drier with a temperature above 200C for 3 minutes (DEK drier model 1209 settings: lamp settings 9 and speed 3. Also, the aluminum paste preferably has a dried film thickness of 15-60 µm, and the thickness of the silver/aluminum electroconductive paste of the present invention is preferably 15-30 µm. Also, the overlapped part of the aluminum paste and the silver/aluminum electroconductive paste is preferably about 0.5-2.5 mm.

Next, the substrate obtained is fired at a temperature of 700-1000° C. for about 3 seconds-15 min, for instance, so that the desired solar cell is obtained (FIG. 2(*d*)). An electrode is formed from the composition(s) of the present invention wherein said composition has been fired to remove the organic medium and sinter the glass frit.

The solar cell obtained using the electroconductive paste of the present invention, as shown in FIG. 2(*d*), has electrodes 104 on the light-receiving face (surface) of the substrate (for example, Si substrate) 102, Al electrodes 110 mainly composed of Al and silver/aluminum electrodes 112 mainly composed of Ag and Al, on the back face.

The present invention will be discussed in further detail by giving practical examples. The scope of the present invention, however, is not limited in any way by these practical examples.

EXAMPLES

The examples cited here are based on firing said example pastes on wafers that have silicon nitride anti-reflection coating and are conventional cell designs with a front side n-type contact thick film silver paste. The performance of the paste is defined in terms of the electrical properties and additionally the bowing of the cell after firing (defined as the deflection of the fired cell at room temperature and the distance traveled at the center of the wafer to achieve a flat cell).

(1) Aluminum Paste With Glass Frit

Mixtures of aluminum powders with glass frits are described here. The relative glass content with respect to the aluminum powder content and particle size affects the electrical properties and the extent of bowing of thinner cells.

In this example, we cite four (4) glass compositions, three of which are lead borosilicate compositions and one is a non-lead containing glass. The systems differ in that A and B are glass systems that will soften and freeze, C and D soften but during cooling will crystallize, glass C will remain liquid to temperatures below 350° C. Glass A represents a prior art glass composition. Glasses B, C, and D represent glasses which are comprised in novel thick film compositions.

TABLE 1

Glass compositions cited

| Weight % as oxides | A | B | C | D |
|---|---|---|---|---|
| SiO2 | 5.40 | 6.00 | 3.50 | 32.72 |
| Al2O3 | 4.10 | | | |
| PbO | 78.10 | 80.50 | 42.40 | |
| ZrO2 | | | | 2.90 |
| B2O3 | 12.40 | 12.00 | 3.60 | 2.90 |
| ZnO | | 1.50 | | 2.91 |
| MgO | | | | 1.17 |
| TiO2 | | | | 5.23 |
| Na2O | | | | 3.10 |
| Li2O | | | | 0.87 |
| Bi2O3 | | | 50.50 | 48.20 |
| α | 9.2 | 10.5 | 18.6 | 12.9 |
| Dilotometric Softening point (° C.) | 400 | 365 | 404 | 460 |

α = Temperature coefficient of expansion ppm/K

These glasses were mixed in as in the manner of the art of making aluminum pastes, into the product L20261 from Silberline (UK) Ltd which contains an aluminum powder. The addition by weight of frits A, B, C and D were varied between 0.25% and 2.5% based on 74% weight of aluminum powder and then printed on 270 micron thick wafers of 125 mm square multicrystalline silicon pre-processed to the point where the next step is printing and firing. The wafers were converted to cells by firing in a Centrotherm 4 zone furnace with zone temperatures defined as zone 1=450° C., zone 2=520° C., zone 3=575° C. and the final zone set at 925° C. or 950° C. with a belt speed of 2500 mm/min. The electrical performance and the measurement of the bow was undertaken, the measurement of the efficiency is shown in Table 2 and Table 3 and the fill factor (FF) is shown in Table 4 and Table 5 and the bow is shown in Table 6.

We should note that from work reported by Young et al (PVSEC conference New Orleans), there is a relationship between the electrical performance and the weight deposit (or thickness) where there is a point where the electrical performance declines seriously if the weight is below this value, for this reason, the thickness of the layer is reported in Table 7 where the pastes are printed at thickness above this so called saturation value.

TABLE 2

Efficiency (%) at peak temperature of 925 C.

| N-type conductor | % Organic | % Al | % Frit | A | B | C | D |
|---|---|---|---|---|---|---|---|
| PV147 | 26.0 | 74 | 0 | 13.09 | 13.09 | 13.09 | 13.09 |
| PV147 | 25.7 | 74 | 0.3 | 12.97 | 12.94 | 13.26 | 13.40 |
| PV147 | 25.5 | 74 | 0.5 | 13.31 | 13.44 | 13.50 | 13.22 |
| PV147 | 25.0 | 74 | 1 | 13.14 | 13.27 | 13.28 | 13.10 |
| PV147 | 24.5 | 74 | 1.5 | 13.35 | 13.18 | 13.21 | 13.45 |
| PV147 | 23.5 | 74 | 2.5 | 13.01 | 13.46 | 13.11 | 12.37 |

TABLE 3

Efficiency (%) at peak temperature of 950 C.

| N-type conductor | % Organic | % Al | % Frit | A | B | C | D |
|---|---|---|---|---|---|---|---|
| PV147 | 26.0 | 74 | 0 | 12.88 | 12.88 | 12.88 | 12.88 |
| PV147 | 25.7 | 74 | 0.3 | 13.25 | 12.85 | 12.87 | 13.28 |
| PV147 | 25.5 | 74 | 0.5 | 13.29 | 13.10 | 13.22 | 13.13 |

TABLE 3-continued

Efficiency (%) at peak temperature of 950 C.

| N-type conductor | % Organic | % Al | % Frit | A | B | C | D |
|---|---|---|---|---|---|---|---|
| PV147 | 25.0 | 74 | 1 | 13.30 | 13.10 | 13.35 | 13.40 |
| PV147 | 24.5 | 74 | 1.5 | 13.33 | 13.25 | 13.19 | 13.22 |
| PV147 | 23.5 | 74 | 2.5 | 12.80 | 13.08 | 13.04 | 13.07 |

TABLE 4

Fill Factor (%) at peak temperature of 925 C.

| N-type conductor | % Organic | % Al | % frit | A | B | C | D |
|---|---|---|---|---|---|---|---|
| PV147 | 26 | 74 | 0 | 70.76 | 70.76 | 70.76 | 70.76 |
| PV147 | 25.7 | 74 | 0.3 | 69.98 | 71.01 | 72.38 | 72.32 |
| PV147 | 25.5 | 74 | 0.5 | 71.26 | 71.88 | 72.23 | 72.85 |
| PV147 | 25 | 74 | 1 | 70.95 | 72.34 | 72.30 | 71.68 |
| PV147 | 24.5 | 74 | 1.5 | 72.43 | 72.85 | 71.93 | 72.35 |
| PV147 | 23.5 | 74 | 2.5 | 71.16 | 73.07 | 72.07 | 68.29 |

TABLE 5

Fill Factor (%) at peak temperature of 950 C.

| N-type conductor | % Organic | % Al | % frit | A | B | C | D |
|---|---|---|---|---|---|---|---|
| PV147 | 26 | 74 | 0 | 70.20 | 70.20 | 70.20 | 70.20 |
| PV147 | 25.7 | 74 | 0.3 | 71.23 | 70.80 | 70.27 | 72.06 |
| PV147 | 25.5 | 74 | 0.5 | 71.22 | 71.53 | 71.77 | 71.52 |
| PV147 | 25 | 74 | 1 | 70.94 | 71.65 | 72.26 | 72.56 |
| PV147 | 24.5 | 74 | 1.5 | 72.17 | 72.87 | 71.53 | 72.49 |
| PV147 | 23.5 | 74 | 2.5 | 70.50 | 72.41 | 71.37 | 72.34 |

TABLE 6

Bowing in microns on 270 um thick wafers

| N-type conductor | % Organic | % Al | % frit | A | B | C | D |
|---|---|---|---|---|---|---|---|
| PV147 | 26 | 74 | 0 | 655 | 655 | 655 | 655 |
| PV147 | 25.7 | 74 | 0.3 | 551 | 530 | 499 | 538 |
| PV147 | 25.5 | 74 | 0.5 | 570 | 610 | 528 | 556 |
| PV147 | 25 | 74 | 1 | 772 | 818 | 637 | 565 |
| PV147 | 24.5 | 74 | 1.5 | 852 | 850 | 733 | 460 |
| PV147 | 23.5 | 74 | 2.5 | 1053 | 1031 | 957 | 388 |

TABLE 7

Fired print thickness (in microns) of Al pastes

| N-type conductor | % Organic | % Al | A | B | C | D |
|---|---|---|---|---|---|---|
| PV147 | 26 | 74 | 0 | 32.0 | 32.0 | 32.0 | 32.0 |
| PV147 | 25.7 | 74 | 0.3 | 32.4 | 34.6 | 29.6 | 32.2 |
| PV147 | 25.5 | 74 | 0.5 | 36.0 | 32.2 | 31.8 | 34.4 |
| PV147 | 25 | 74 | 1 | 33.6 | 32.0 | 29.4 | 32.8 |
| PV147 | 24.5 | 74 | 1.5 | 32.2 | 43.4 | 34.8 | 33.0 |
| PV147 | 23.5 | 74 | 2.5 | 35.4 | 56.8 | 34.4 | 31.8 |

The examples cited show that the addition of the glass frits A, B, C and D to the aluminum powder alone provides better electrical performance. The performance is a function of frit content, chemistry and the firing temperature.

Based on a bi-metallic strip model, it is expected that materials that have an increasing difference of temperature coefficient of expansion from the base substrate would expect to have larger bow and that an increased freezing point materials would also contribute to larger bowing. The bimetallic strip model would predict that the bowing would become greater for increasing addition of frit to the system. The equation for the deflection of a bimetallic strip is given by:

$$\delta = \frac{3(\alpha_b - \alpha_a)(T_f - T)(t_b + t_a)d^2}{4t_b^2(4 + 6t_a/t_b + 4(t_a/t_b)^2 + (E_a/E_b)(t_a/t_b)^3 + (E_b/E_a)(t_b/t_a))}$$

where $\delta$ is the deflection (m), $t_a$ is the thickness of the top layer (m), $t_b$ is the thickness of the bottom layer (m), $T_f$ is the freezing temperature (° C.), T is the measuring temperature (° C.), $\alpha_a$ is the TCE for top component ($10^{-6}$ $K^{-1}$), $\alpha_b$ is the TCE for the bottom component ($10^{-6}$ $K^{-1}$), $E_a$ is the elastic modulus for the top component (Pa), $E_b$ is the elastic modulus for the bottom component (Pa) and d is the width of the smaller component (m).

TABLE 8

Bow data (in microns) for 270 um thick wafers for glass A, B, C and D with temperature coefficient of expansion data (in ppm/K) and softening data ° C. (SP) as a function of % glass content

| Frit | Alpha | SP | 0% | 0.3% | 0.5% | 1% | 1.5% | 2.5% |
|---|---|---|---|---|---|---|---|---|
| A | 9.2 | 400 | 655 | 551 | 570 | 772 | 852 | 1053 |
| B | 10.5 | 365 | 655 | 530 | 610 | 818 | 850 | 1031 |
| C | 18.6 | 404 | 655 | 499 | 528 | 637 | 733 | 957 |
| D | 12.9 | 460 | 655 | 538 | 556 | 565 | 460 | 388 |

So in the examples cited here, we see
  That the extent of bow increases in general for increased frit in line with the predictions of the bi-metallic strip.
  That the extent of bow would be expected to increase for glasses with higher α compared to silicon (2.4 ppm/K). Glasses C and D do not adhere to the predicted behavior from the bi-metallic model as the bowing is less.
  That the extent of bow is decreased when the softening point of the glass is increased. Glasses C and D do not adhere to this predicted behavior from the bi-metallic model as the bowing is less than lower softening point systems.
  That the extent of bow below 0.5% addition can be less than the system without glass at all and is a property of the addition and not the frit chemistry cited in these examples.
  Glass frits C and D are known to recrystallize (phase separation) during cooling into a crystalline precipitate within the glass surrounded by a lower softening or freezing point phase that the system that was originally added to the system. FIG. 4 represents the bowing as a function of softening point in degrees C.
  Uniquely, the extent of bow of the systems that crystallize cited here can be lower as the frit content is increased as shown for glass D. In the case of glass D, α, is negative between room temperature and 150° C. approximately as shown in the dilatometric trace shown in FIG. 5. The ability for the system to facilitate lower bow than the conventional frits enables this system to provide very low bow in silicon cells of thickness of below 225 microns and thus for manufacturers to use them during post firing handling and module manufacturer with less tendency to break due to handling difficulties. FIG. 6 demonstrates the bowing performance in 270 micron wafers (125×125 mm) of each of the identified glass frits.

Manufacture of Solar Cell

The present invention can be applied to a broad range of semiconductor devices, although it is especially effective in light-receiving elements such as photodiodes and solar cells. The discussion below describes how a solar cell was formed utilizing the composition(s) of present invention. One skilled in the art realizes that various embodiments of solar cell formation are useful in the present invention.

Using the aluminum electroconductive paste obtained, a solar cell was formed in the following sequence.

(1) On the back face of a Si substrate having a silver electrode on the front surface (for example, PV147 Ag composition commercially available from E. I. du Pont de Nemours and Company) was printed and dried. Typical dried thickness is in the range of 15 to 25 microns. Then, the Ag or Ag/Al paste (for example, PV202 is a Ag/Al composition commercially available from E. I. du Pont de Nemours and Company) was printed and dried as 5-6 mm wide bus bars. Then, an aluminum paste for the back face electrode of a solar cell (represents the novel compositions of the present invention) was screen-printed at a dried film thickness of 30-60 μm providing overlap of the aluminum film with the Ag/Al busbar for 1 mm at both edges to ensure electrical continuity. The aluminum paste was dried before firing.

(2) The printed wafers were then fired in a furnace with peak temperature settings of 850 to 965° C. for 3 seconds to 10 minutes, depending on the furnace dimensions and temperature settings. A solar cell was formed after firing.

Test Procedure-Efficiency

The solar cells built according to the method described above were placed in a commercial IV tester for measuring efficiencies (IEET Ltd). The lamp in the IV tester simulated the sunlight with a known intensity and radiated the front surface of the cell, the bus bars printed in the front of the cell were connected to the multiple probes of the IV tester and the electrical signals were transmitted through the probes to the computer for calculating efficiencies.

Solar cell wafers were prepared by using a standard frontside contact paste PV147 Ag conductor (commercially available from E. I. du Pont de Nemours and Company).

Samples were printed onto Wafers Supplied by a PV cell manufacturer that were processed to the point where the thick film pastes were applied and fired. Processed wafers were then measured for electrical performance. Results indicate that the use of frits A, B, C and D when added to Al powder has improved the electrical performance versus the unfritted system.

What is claimed is:

1. A thick film conductor composition comprised of
   (a) aluminum-containing powder
   (b) at least one glass frit composition, dispersed in
   (c) organic medium
   wherein said glass frit composition upon firing undergoes a recrystallization process and liberates both a glass and a crystalline phase and wherein said glass phase of said recrystallization process comprises a glass that has a lower softening point than the original softening point of said glass frit composition.

2. The composition of claim 1 wherein said original softening point is in the range of 325° C. to 600° C.

3. The composition of claim 1 wherein the total glass frit content is in the range of 0.01 weight percent to 5 weight percent based on total thick film composition.

4. The composition of claim 1 further comprising an Ag-containing powder.

5. A semiconductor device formed by the process of claim 4.

6. A semiconductor device which utilizes the composition of claim 4.

7. The thick film conductor composition of claim 1 wherein said glass frit composition is a lead-free glass frit composition.

8. The thick film composition of claim 1 wherein said organic medium comprises a polymeric binder and a volatile organic solvent.

9. The composition of claim 1 wherein upon firing said composition provides an exothermic chemical reaction between 280° C. and 900° C.

10. A process of forming a solar cell utilizing a silicon substrate having a p-type and an n-type region, and a p-n junction, which comprises screen-printing the back-side of said substrate, screen printing the composition of claim 1, and firing the printed surface at a temperature of 500-990 degrees C.

11. An electrode utilizing the composition of claim 1.

12. A semiconductor device which utilizes the thick film composition of claim 1.

13. A thick film conductor composition comprised of
   (a) aluminum-containing powder
   (b) at least one glass frit composition, dispersed in
   (c) organic medium
   wherein said glass frit composition upon firing,
   (1) undergoes a recrystallization process and liberates both a glass and a crystalline phase and wherein said glass phase of said recrystallization process comprises a glass that has a lower softening point than the original softening point of said glass frit composition, and
   (2) exhibits a negative temperature coefficient of expansion in the temperature range of 20° C. to 200° C.

* * * * *